(12) United States Patent
Yang

(10) Patent No.: US 6,836,173 B1
(45) Date of Patent: Dec. 28, 2004

(54) HIGH-SIDE TRANSISTOR DRIVER FOR POWER CONVERTERS

(75) Inventor: Ta-yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 10/671,272

(22) Filed: Sep. 24, 2003

(51) Int. Cl.⁷ .............................................. H03K 17/16
(52) U.S. Cl. ........................ 327/390; 327/108; 326/88
(58) Field of Search .................................. 327/390, 391, 327/108, 111, 112, 170, 423, 424, 427, 374, 376, 377, 333, 588, 589; 326/88, 83, 27, 81

(56) References Cited

U.S. PATENT DOCUMENTS

| | | | |
|---|---|---|---|
| 5,381,044 A | | 1/1995 | Zisa et al. .................. 327/109 |
| 5,559,452 A | * | 9/1996 | Saito .......................... 326/88 |
| 5,638,025 A | | 6/1997 | Johnson ....................... 337/255 |
| 5,672,992 A | | 9/1997 | Nadd .......................... 327/390 |
| 5,742,196 A | * | 4/1998 | Fronen et al. ............... 327/382 |
| 5,877,635 A | * | 3/1999 | Lin ............................... 326/83 |
| 5,952,865 A | * | 9/1999 | Rigazio ....................... 327/108 |
| 6,037,720 A | * | 3/2000 | Wong et al. ................. 327/108 |
| 6,100,744 A | * | 8/2000 | Yoon et al. .................. 327/390 |
| 6,344,959 B1 | | 2/2002 | Milazzo ....................... 361/92 |
| 6,353,345 B1 | * | 3/2002 | Yushan et al. .............. 327/112 |

* cited by examiner

Primary Examiner—Long Nguyen
(74) Attorney, Agent, or Firm—J.C. Patents

(57) ABSTRACT

The high-side transistor driver according to the present invention includes a high-side transistor, a low-side transistor, a drive-buffer and an on/off transistor. When the low-side transistor is turned on, a charge-pump diode and a bootstrap capacitor produce a floating voltage. The drive-buffer will propagate the floating voltage to switch on the high-side transistor. The on/off transistor is used to switch the drive-buffer. The high-side transistor drive further includes a speed-up circuit. The speed-up circuit has a capacitive coupling for generating a differential signal. When the on/off transistor is turned off, the speed-up circuit accelerates the charge-up of the parasitic capacitor of the on/off transistor, thus accelerating high-side transistor switching.

11 Claims, 3 Drawing Sheets

HIGH-SIDE TRANSISTOR DRIVER FOR POWER CONVERTERS

BACKGROUND OF THE INVENTION

1. Field of the Invention

The present invention relates to a high-side transistor driver, and more particularly to a driver circuit for driving the high-side transistor of a power converter.

2. Description of the Prior Art

Many modern-day power converters use bridge circuits to control a voltage source coupled to a load. Power supplies and motor drivers are common examples of such power converters.

A bridge circuit normally has a pair of transistors connected in series across the voltage source, with a high-side transistor connected to the voltage source and a low-side transistor connected to the ground reference. The bridge circuit includes a common node that is connected between the high-side transistor and low-side transistor. This common node is also coupled to the load.

The high-side transistor and the low-side transistor are controlled to alternately conduct. As this happens, the voltage of the common node will swing between the voltage of the voltage source and the ground reference. Thus, the voltage of the node will adjust to the level of the voltage source when the high-side transistor is turned on. This happens, because turning on the high-side transistor shifts the bridge circuit into a low impedance state. In order to fully turn on the high-side transistor, a gate driving voltage higher than that of the voltage source is required. Therefore, the voltage at the gate and at the source of the high-side transistor must be floated with respect to the ground reference.

FIG. 1 shows a prior art bridge circuit that uses a bootstrap capacitor 30 and a charge-pump diode 40 to create a floating voltage $V_{CC}$ for driving the gate of the high-side transistor 10. When an on/off transistor 45 is turned on, the gate of the high-side transistor 10 will be connected to the ground reference via a diode 42. This will turn off the high-side transistor 10. Once the high-side transistor 10 is turned off and a low-side transistor 20 is turned on, the floating voltage of the bootstrap capacitor 30 will be charged up by a bias voltage $V_B$ via the charge-pump diode 40. Switching off the on/off transistor 45 will propagate the floating voltage $V_{CC}$ via a transistor 41 to the gate of the high-side transistor 10. This will turn on the high-side transistor 10.

One drawback of this circuit is that it has high switching losses in high-voltage applications. The on/off transistor 45 requires a high voltage manufacturing process to be suitable for high-voltage source applications (200 volts or more). Such high-voltage transistors typically have a large parasitic capacitor, which will increase the rising-time and slow down the switching signal. This will result in high switching losses from the high-side transistor. Therefore, this prior-art bridge circuit is inadequate for high-voltage and high-speed applications.

Many recently developed bridge circuit designs include methods of generating a suitable gate-voltage for the high-side transistor. Some well known prior-art inventions include U.S. Pat. No. 5,381,044 (Zisa, Belluso, Paparo), U.S. Pat. No. 5,638,025 (Johnson), and U.S. Pat. No. 5,672,992 (Nadd). These prior-art bridge circuits share the same drawbacks as the circuit shown in FIG. 1. The on/off transistors of these prior-art inventions cause high switching losses in high-voltage applications.

To overcome some of these objections, a prior art bridge circuit using a boost converter technique has been introduced in U.S. Pat. No. 6,344,959 (Milazzo). However, this technique uses a voltage doubling circuit that requires an additional switching element as well as other circuitry, thereby adding to the cost and complexity of the driving circuit. Moreover, high frequency charging and discharging of the voltage doubling capacitor in the charge pump will result in severe noise being generated at the voltage source terminal and the ground reference terminal.

The objective of the present invention is to overcome the drawbacks of prior art bridge circuits and to provide a high-side transistor driver that is suitable for high-voltage and high-speed applications.

SUMMARY OF THE INVENTION

The high-side transistor driver according to the present invention includes a floating-ground terminal and a floating-supply terminal. The floating-ground terminal is connected to the source of the high-side transistor, and the floating-supply terminal is used to supply a floating voltage to the high-side transistor driver.

The high-side transistor driver includes a charge-pump diode and a bootstrap capacitor connected in series. The charge-pump diode is supplied with a bias voltage. The bootstrap capacitor is connected to the floating-ground terminal. When the low-side transistor is turned on, the bias voltage will charge up the bootstrap capacitor and produce a floating voltage at the floating-supply terminal. The high-side transistor driver further includes an inverter to drive the high-side transistor. An on/off transistor is included to turn the high-side transistor on and off.

The high-side transistor driver further includes a speed-up circuit. The speed-up circuit includes an accelerative p-transistor, a current source, an inverter, and two protection diodes. When the accelerative p-transistor is turned on, the parasitic capacitor of the on/off transistor can be charged up rapidly. The accelerative p-transistor is coupled to a capacitor, so that the capacitance of the capacitor and the amplitude of the current supplied by the current source determine the on-time of the accelerative p-transistor. This ensures that the accelerative p-transistor will be turned on within the on-time period, following the rising-edge of the input signal.

The high-side transistor driver according to the present invention introduces a method of driving the high-side transistor in high-voltage and high-speed applications. Moreover, the efficiency of the high-side transistor driver is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention.

DESCRIPTION OF THE PREFERRED EMBODIMENTS

Figure 1:
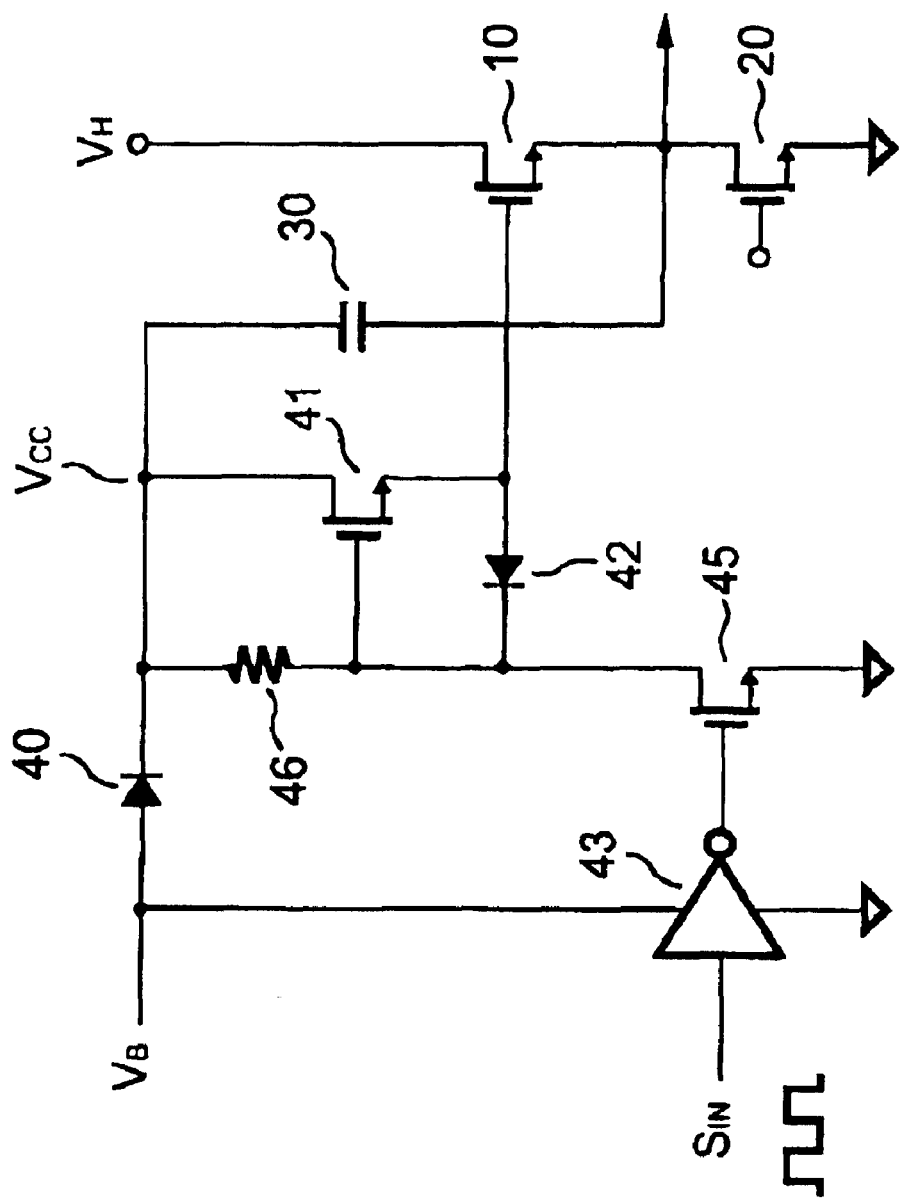
FIG. 1 shows a traditional high-side transistor driver.
Figure 2:
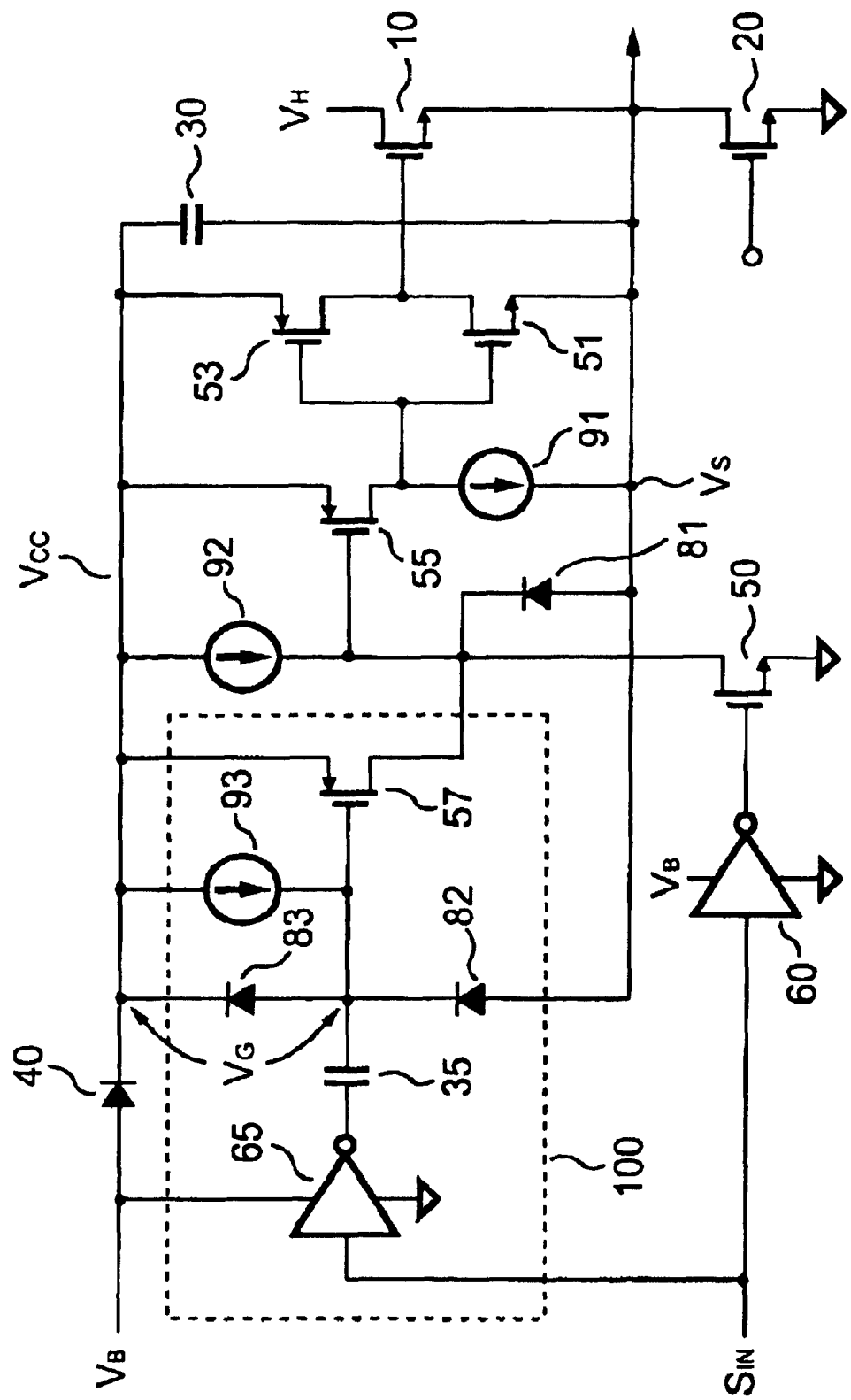
FIG. 2 shows the schematic circuit of a high-side transistor driver according to the present invention.

FIG. 2 shows a high-side transistor driver according to the present invention, in which a floating-ground terminal is connected to a source of a high-side transistor 10. A floating-supply terminal $V_{CC}$ is used for supplying a floating voltage to the high-side transistor driver. A charge-pump diode 40 and a bootstrap capacitor 30 are connected in series. An anode of the charge-pump diode 40 is supplied with a bias voltage $V_B$, and a negative terminal of the bootstrap capacitor 30 is connected to the floating-ground terminal $V_S$. A cathode of the charge-pump diode 40 and a positive terminal of the bootstrap capacitor 30 are connected to the floating-supply terminal $V_{CC}$.

When a low-side transistor 20 is turned on, the bias voltage $V_B$ will charge up the bootstrap capacitor 30 and produce the floating voltage at the floating-supply terminal $V_{CC}$. The high-side transistor driver further includes an inverter for driving the high-side transistor 10. The inverter consists of a p-transistor 53 and an n-transistor 51.

A source of the p-transistor 53 is connected to the floating-supply terminal $V_{CC}$. A source of the n-transistor 51 is connected to the floating-ground terminal $V_S$. A gate of the p-transistor 53 is connected to a gate of the n-transistor 51. A drain of the p-transistor 53 and a drain of the n-transistor 51 are tied together to drive a gate of the high-side transistor 10. A current sink 91 is connected from the gate of the n-transistor 51 to the floating-ground terminal $V_S$. A source of a p-transistor 55 is connected to the floating-supply terminal $V_{CC}$. To enable the n-transistor 51, a drain of the p-transistor 55 is coupled to the gate of the n-transistor 51. When the p-transistor 55 is turned on, the high-side transistor 10 will be switched off.

When the p-transistor 55 is turned off, the current sink 91 is used to turn on the p-transistor 53 and to switch on the high-side transistor 10. A current source 92 is connected from the floating-supply terminal $V_{CC}$ to a gate of the p-transistor 55. An anode of a diode 81 is connected to the floating-ground terminal $V_S$. A cathode of the diode 81 is connected to the gate of the p-transistor 55. A transistor 50 is used to control the high-side transistor 10. The transistor 50 is a high-voltage transistor suitable for high-voltage applications. In order to switch the p-transistor 55, a drain of the transistor 50 is connected to the gate of the p-transistor 55. A source of the transistor 50 is connected to the ground reference. The current source 92 is utilized to rapidly charge up the parasitic capacitor of the transistor 50 and to turn off the p-transistor 55 while the transistor 50 is turned off.

An input of an inverter 60 is supplied with an input signal $S_{IN}$. An output of the inverter 60 is connected to a gate of the transistor 50. Thus, the transistor 50 will be turned on and off in response to the input signal $S_{IN}$.

The high-side transistor driver according to the present invention further includes a speed-up circuit 100 having a capacitive coupling. The speed-up circuit 100 has an output terminal connected to the gate of the p-transistor 55. An input of the speed-up circuit 100 is supplied with the input signal $S_{IN}$. The speed-up circuit 100 generates a differential signal $V_G$ in response to the input signal $S_{IN}$. The differential signal $V_G$ will accelerate the charge-up of the parasitic capacitor of the transistor 50, and thus speed-up the turn-on of the high-side transistor 10. The speed-up circuit 100 comprises a p-transistor 57, a current source 93, a capacitor 35, an inverter 65, a diode 82, and a diode 83. A source of the p-transistor 57 is connected to the floating-supply terminal $V_{CC}$. A drain of the p-transistor 57 is connected to the output of the speed-up circuit 100. The p-transistor 57 will charge up the parasitic capacitor of the transistor 50 when the p-transistor 57 is turned on. The current source 93 is connected from the floating-supply terminal $V_{CC}$ to a gate of the p-transistor 57. The diode 82 and the diode 83 are connected in series. A cathode of the diode 83 is connected to the floating-supply terminal $V_{CC}$. An anode of the diode 82 is connected to the floating-ground terminal $V_S$. To protect the gate of the p-transistor 57 from over-voltage stress, a cathode of the diode 82 and an anode of the diode 83 are connected to the gate of the p-transistor 57. An input of the inverter 65 is connected to the input of the speed-up circuit 100. To provide capacitive coupling, the capacitor 35 is connected from an output of the inverter 65 to the gate of the p-transistor 57.

Figure 3:
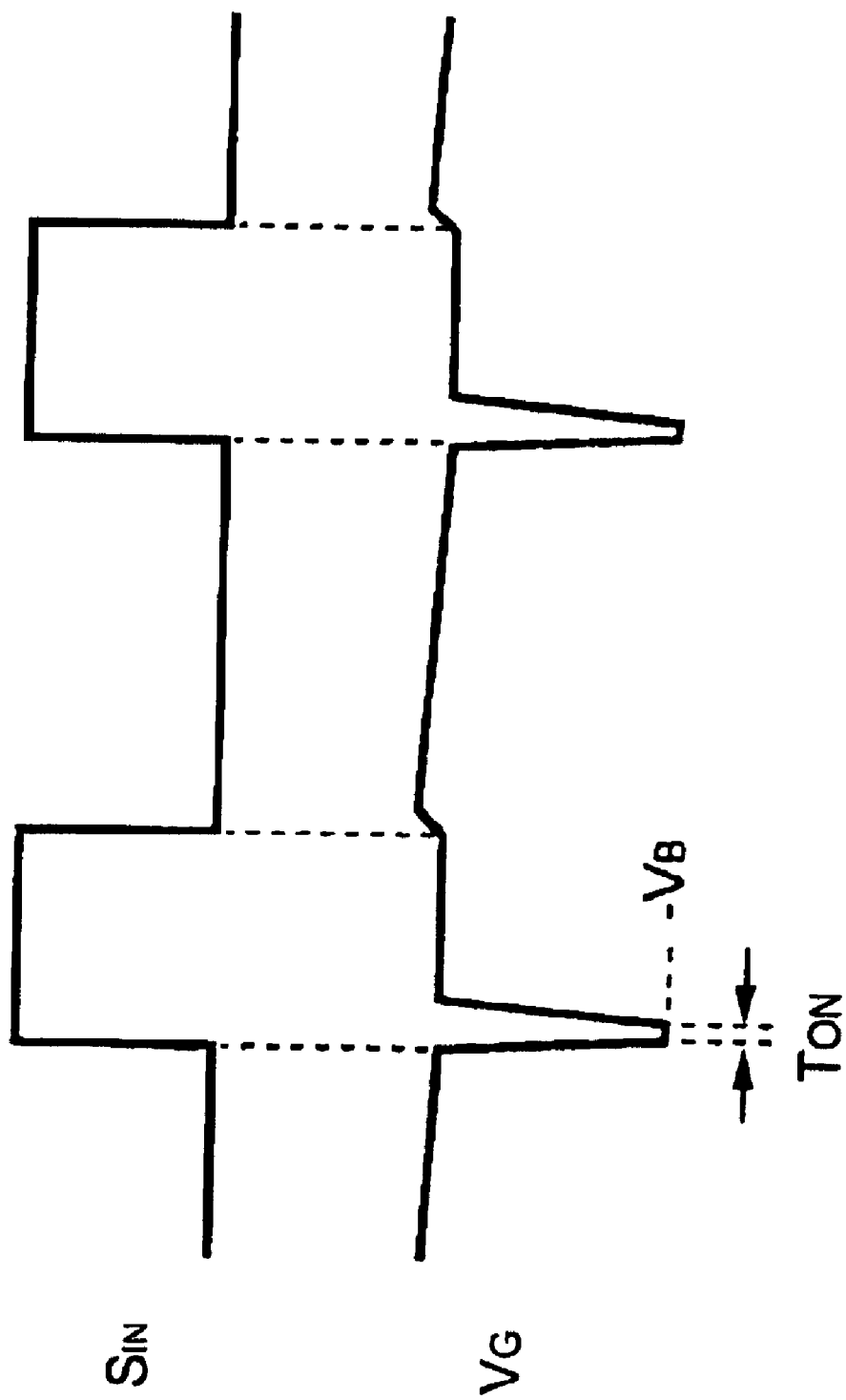
FIG. 3 illustrates a timing diagram demonstrating the operation of the schematic circuit shown in FIG. 2.

The capacitor 35 is coupled with the inverter 65 to generate the differential signal $V_G$ at the gate of the p-transistor 57 for switching the p-transistor 57. The on-time $T_{ON}$ of the p-transistor 57 is determined in response to the amplitude of the current from the current source 93 and the capacitor of the capacitor 35. The waveform of the differential signal $V_G$ is shown in FIG. 3. Following the rising-edge of the input signal $S_{IN}$ the p-transistor 57 is turned on within the on-time $T_{ON}$. Due to the on-time $T_{ON}$, the speed-up circuit 100 provides a parallel current. The parallel current associates with the current source 92 to charge the parasitic capacitor of the transistor 50. This will accelerate the high-side transistor 10 to be switched on. Thus, the acceleration of switching on the high-side transistor 10 is limited by the turn-on time $T_{ON}$. When the transistor 50 is turned on to switch off the high-side transistor 10, the p-transistor 57 is off. Therefore, the p-transistor 57 will not consume any power while the transistor 50 is turned on. Besides, while the high-side transistor 10 is switched on, the speed-up circuit 100 mostly charges the parasitic capacitor of the transistor 50. This can help to decrease the amplitude of the current drawn from the current source 92. Thus, the stress of the transistor 50 will be reduced and the efficiency of the high-side transistor driver is improved.

The high-side transistor driver according to the present invention overcomes the drawbacks of prior-art high-side transistor drivers. In particular, the high-side transistor driver according to the present invention is suitable for use in high-voltage and high-speed applications. Furthermore, the high-side transistor driver according to the present invention operates more efficiently than prior-art high-side transistor drivers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims or their equivalents.

What is claimed is:

1. A driver, comprising:
   a high-side transistor;
   a low-side transistor coupled to the high-side transistor;
   a floating-ground terminal, connected to a source of said high-side transistor;
   a floating-supply terminal, for providing a floating voltage for the high-side transistor driver;
   a charge-pump diode, having a cathode connected to said floating-supply terminal, wherein an anode of said charge-pump diode is supplied with a bias voltage;
   a bootstrap capacitor, connected in series with said charge-pump diode, wherein a negative terminal of said bootstrap capacitor is connected to said floating-ground terminal, and wherein a positive terminal of said bootstrap capacitor is connected to said floating-supply terminal;

a p-transistor, having a source connected to said floating-supply terminal, an n-transistor, having a source connected to said floating-ground terminal, wherein a gate of said n-transistor is connected to a gate of said p-transistor, wherein a drain of said n-transistor forms a junction with a drain of said p-transistor, and wherein the voltage at said junction drives a gate of said high-side transistor; and a current sink, connected from the gate of said n-transistor to said floating-ground terminal, for continuously sinking current.

2. The driver as claimed in claim 1, wherein said bias voltage charges said bootstrap capacitor whenever said low-side transistor is turned on, wherein said bias voltage supplies said floating voltage at the floating-supply terminal whenever said low-side transistor is turned on.

3. The driver as claimed in claim 1 further comprising:

a control p-transistor, having a source connected to said floating-supply terminal, wherein said control p-transistor has a drain coupled to said gate of said n-transistor;

a first current source connected from said floating-supply terminal to a gate of said control p-transistor;

a first diode, having an anode connected to said floating-ground terminal, wherein said first diode having a cathode connected to said gate of said control p-transistor;

an on/off transistor, for switching said control p-transistor, wherein said on/off transistor has a drain connected to said gate of said control p-transistor, wherein a source of said on/off transistor is connected to the ground reference;

a first inverter, having an input supplied with an input signal, wherein said first inverter has an output connected to a gate of said on/off transistor; and a speed-up circuit, having an output connected to said gate of said control p-transistor, wherein said input signal is supplied to an input of said speed-up circuit, and wherein said speed-up circuit has a capacitive coupling.

4. The driver as claimed in claim 3, wherein said n-transistor is turned on and said high-side transistor is switched off whenever said control p-transistor is turned on.

5. The driver as claimed in claim 3, wherein said current sink is utilized to turn on said p-transistor and switch on the high-side transistor whenever said control p-transistor is turned off.

6. The driver as claimed in claim 3, wherein said first current source is utilized to charge up a parasitic capacitance of said on/off transistor and turn off said control p-transistor.

7. The driver as claimed in claim 3, wherein said on/off transistor is turned off whenever said input signal is high.

8. The driver as claimed in claim 3, wherein said speed-up circuit generates a control signal in response to said input signal, and wherein said control signal accelerates the charge-up of a parasitic capacitance of said on/off transistor and accelerates the turn-on of the high-side transistor.

9. The driver according to claim 3, wherein said speed-up circuit comprises:

an accelerative p-transistor, having a source connected to said floating-supply terminal, wherein said accelerative p-transistor has a drain connected to said output of said speed-up circuit;

a second current source, connected from said floating-supply terminal to a gate of said accelerative p-transistor;

a second diode, having an anode connected to said floating-ground terminal, wherein said second diode has a cathode connected to said gate of said accelerative p-transistor;

a third diode, connected in series with said second diode, wherein said third diode has a cathode connected to said floating-supply terminal, and wherein said third diode has an anode connected to said gate of said accelerative p-transistor;

a capacitor, for switching said accelerative p-transistor; and a second inverter, having an input connected to said input of said speed-up circuit, wherein said capacitor is connected from an output of said second inverter to said gate of said accelerative p-transistor.

10. The driver according to claim 9, wherein said accelerative p-transistor charges up a parasitic capacitance of said on/off transistor whenever said accelerative p-transistor is turned on.

11. The driver according to claim 9, wherein said accelerative p-transistor is turned on within a time-constant, wherein the length of the time-constant is proportional to the product of the amplitude of the current from said second current source and the capacitance of said capacitor.

* * * * *